United States Patent [19]

Miura et al.

[11] Patent Number: 5,148,247
[45] Date of Patent: Sep. 15, 1992

[54] SEMICONDUCTOR DEVICE HAVING TRENCH ISOLATION

[75] Inventors: Takao Miura, Tokyo; Kazunori Imaoka, Komae, both of Japan

[73] Assignee: Fujitsu Limited, Kawasaki, Japan

[21] Appl. No.: 755,596

[22] Filed: Sep. 5, 1991

Related U.S. Application Data

[63] Continuation of Ser. No. 297,469, Jan. 17, 1989, abandoned.

[30] Foreign Application Priority Data

Jan. 21, 1988 [JP] Japan ..................................... 63-9458

[51] Int. Cl.⁵ ............................................. H01L 29/68
[52] U.S. Cl. ................................ 357/23.6; 357/23.11; 357/49; 357/50
[58] Field of Search ............. 357/49, 50, 23.11, 23.66, 357/55; 437/67

[56] References Cited

U.S. PATENT DOCUMENTS

| | | | |
|---|---|---|---|
| 3,463,974 | 8/1969 | Kelley et al. | 357/23.11 |
| 3,787,251 | 1/1974 | Brand et al. | 357/23.11 |
| 4,755,863 | 7/1988 | Maeda | 357/49 |
| 4,866,494 | 9/1989 | Kurosawa | 357/23.6 G |

FOREIGN PATENT DOCUMENTS

| | | | |
|---|---|---|---|
| 0177066 | 4/1986 | European Pat. Off. | 357/23.6 G |
| 0245783 | 11/1987 | European Pat. Off. | |
| 44-26570 | 11/1969 | Japan . | |
| 57-159030 | 10/1982 | Japan . | |
| 60-43843 | 3/1985 | Japan | 437/67 |
| 61-58266 | 3/1986 | Japan | 357/23.5 G |
| 61-154160 | 7/1986 | Japan | 357/23.6 G |
| 62-113467 | 5/1987 | Japan | 357/23.6 G |

OTHER PUBLICATIONS

Oh et al., U.S. SIR H204, Feb. 1987.
INSPEL Search Report–"Trench–Isolation . . . " Miura, T. et al., Japan Soc. Appl. Physics 1988.
Digest of Technical Papers–1988 Symposium on VLSI Technology IEEE pp. 19–20; T. Miura et al.: "Trench–Isolation Technology Using A1 Ion Implantation in a SI 02 Layer".
IEEE Transactions on Nuclear Science, vol. NS-22, No. 6, Dec. 1975, New York US pp. 2168–2173; S. T. Wang et al.: "The Effect of Ion Implantation on Oxide Storage in MOS Devices".
"Characterization of Electron Traps in Aluminum-Implanted SiO₂", D. R. Young et al., IBM J. Res. Develop., vol. 22, No. 3, May 1978, pp. 285–288.
"Location of Trapped Charge in Aluminum-Implanted SiO₂", D. J. DiMaria et al., IBM J. Res. Develop., vol. 22, No. 3, May 1978, pp. 289–293.
"Modification of Interfacial Charge Between SiO₂ and Silicon", S. Aronowitz et al., Appl. Phys. Lett. 52(11), 14 Mar. 1988, pp. 913–915.
"The Effect of Ion Implantation on Oxide Charge Storage in MOS Devices", S. T. Wang et al., IEEE Transactions on Nuclear Science, vol. NS-22, No. 6, Dec. 1975, pp. 2168–2173.
"Physical Mechanisms of Radiation Hardening of MOS Devices by Ion Implantation", O. L. Curtis, Jr. et al., IEEE Transactions on Nuclear Science, vol. NS-22, No. 6, Dec. 1975, pp. 2174–2180.

*Primary Examiner*—Andrew J. James
*Assistant Examiner*—Courtney A. Bowers
*Attorney, Agent, or Firm*—Armstrong & Kubovcik

[57] ABSTRACT

A semiconductor device having a trench isolation structure comprises a substrate, an active layer formed on the substrate, a trench which penetrates the active layer and reaches a portion of the substrate, and an insulator layer formed within the trench. The active layer has a region in which elements of the semiconductor device are formed, and the insulator layer has charges trapped in at least a predetermined portion thereof in a vicinity of the second region. This predetermined portion of the insulator layer has a depth which is greater than a depth of the region of the active layer.

23 Claims, 11 Drawing Sheets

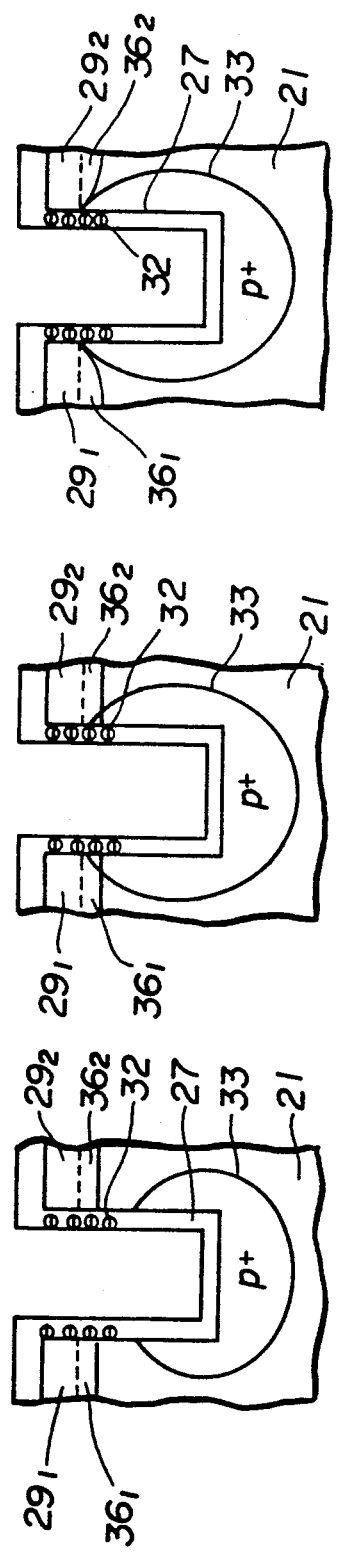
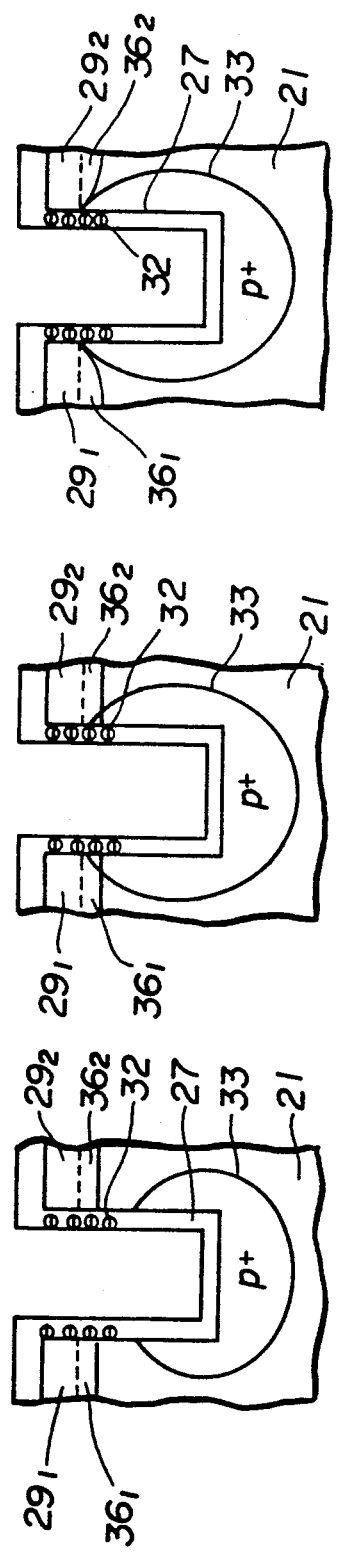
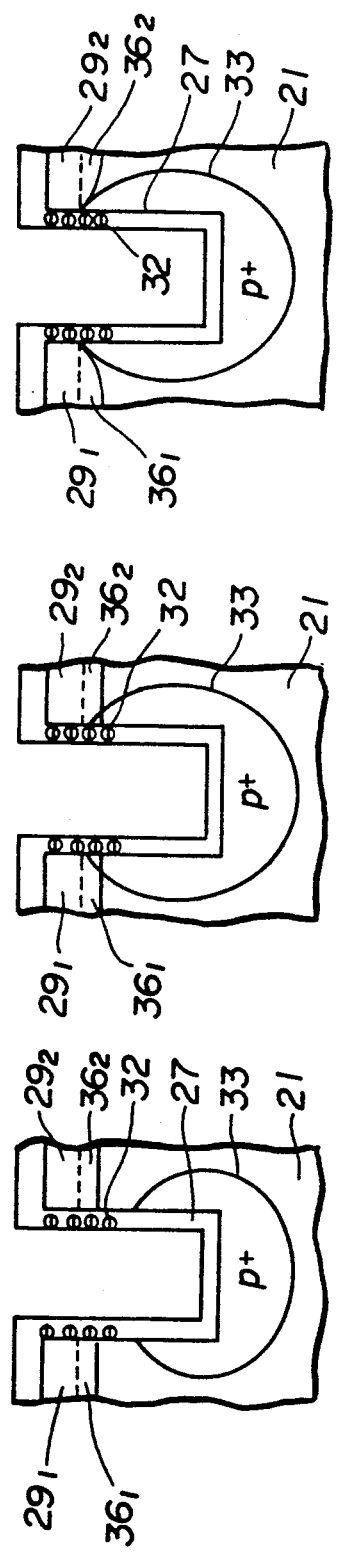
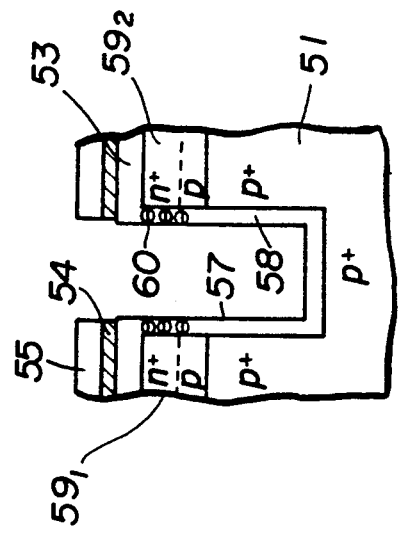
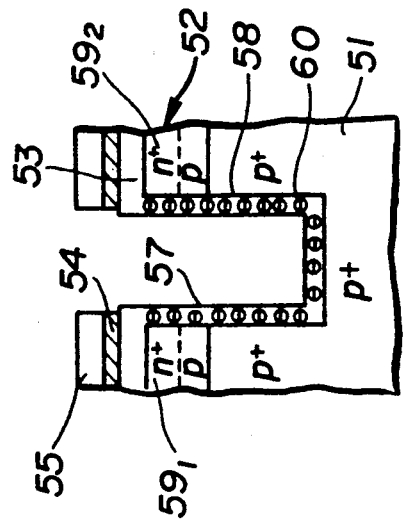

SEMICONDUCTOR DEVICE HAVING TRENCH ISOLATION

This application is a continuation of application Ser. No. 297,469 filed Jan. 17, 1989, abandoned.

BACKGROUND OF THE INVENTION

The present invention generally relates to semiconductor devices, and more particularly to a semiconductor device having a trench isolation structure.

FIG. 1 generally shows a cross sectional view of a conventional semiconductor device having trench isolation. This conventional semiconductor device has a p-type substrate 10, trench isolations 11, and field effect transistors (FETs) 12 and 13. The trench isolation 11 consists of an oxide layer 11a formed within a trench 11b. The FET 12 has an $n^+$-type source (diffusion) region 12S, a p-type gate region 12G and an $n^+$-type drain (diffusion) region 12D. Similarly, the FET 13 has an $n^+$-type source (diffusion) region 13S, a p-type gate region 13G and an $n^+$-type drain (diffusion) region 13D.

FIG. 2 generally shows a plan view of the semiconductor device shown in FIG. 1. In FIG. 2, the same designations are used as in FIG. 1.

According to this conventional semiconductor device, an interface state is formed at an interface between the substrate 10 and the oxide layer 11a within the trench 11b. Hence, a depletion layer is formed at the interface. In this case, since the drain region 12D of the FET 12 and the source region 13S of the adjacent FET 13 are located on respective sides of the trench isolation 11, carriers from one of the regions 12D and 13S leak to the other of the regions 12D and 13S through the depletion layer, thereby causing an unwanted vertical direction leak current Lv to flow between the adjacent FETs 12 and 13. This vertical direction leak current Lv flows between two mutually adjacent elements of the semiconductor device.

On the other hand, the depletion layer is also formed at the side walls of the trench isolation 11 within the same FET 12, for example. Even when no gate voltage is applied to the gate region 12G, there is a problem in that a lateral direction leak current L1 flows between the source and drain regions 12S and 12D of the FET 12. This lateral direction leak current L1 flows within the same element of the semiconductor device.

FIG. 3 is a schematic view of the conventional semiconductor device shown in FIGS. 1 and 2 showing the vertical and lateral leak currents Lv and Ll. In FIG. 3, the same designations are used as in FIGS. 1 and 2.

In order to prevent the formation of the depletion layer at the interface between the substrate 10 and the oxide layer 11a within the trench 11b, it is known to implant boron (B) impurities at the interface with an impurity concentration greater than that of the substrate 10, as shown in FIG. 4. In FIG. 4, those parts which are the same as those corresponding parts in FIG. 3 are designated by the same reference numerals, and a description thereof will be omitted. In this case, a boron (B) layer 15 is formed at the interface and it is possible to prevent the formation of the depletion layer so as to prevent the vertical and lateral leak currents Lv and Ll from being generated.

However, during a thermal process which is carried out after the B impurities are implanted, the B impurities are widely diffused within the substrate 10 due to the thermal process and the so-called narrow channel effect occurs. A narrow channel is indicated by NC in FIG. 4. For this reason, the semiconductor device shown in FIG. 4 suffers a problem in that the current driving capability of the FET 12 is deteriorated by the narrow channel NC.

SUMMARY OF THE INVENTION

Accordingly, it is a general object of the present invention to provide a novel and useful semiconductor device in which the problems described above are eliminated.

Another and more specific object of the present invention is to provide a semiconductor device having such a trench isolation structure that no lateral and vertical direction leak currents flow and no narrow channel effect occurs.

Still another object of the present invention is to provide a semiconductor device having a trench isolation structure comprising a substrate made of a first type semiconductor which is one of n-type and p-type semiconductors, an active layer formed on the substrate and also made of the first type semiconductor, a trench which penetrates the active layer and reaches a portion of the substrate, and an insulator layer formed within the trench. The active layer has a region in which elements of the semiconductor device are formed, and the insulator layer has charges trapped in only a predetermined portion thereof in a vicinity of the region. This predetermined portion of the insulator layer has a depth which is greater than a depth of the region of the active layer. According to the semiconductor device of the present invention, it is possible to effectively suppress the lateral direction leak current within the element of the semiconductor device.

A further object of the present invention is to provide a semiconductor device having a trench isolation structure comprising a substrate made of a first type semiconductor which is one of n-type and p-type semiconductors, an active layer formed on the substrate and also made of the first type semiconductor, a trench which penetrates the active layer and reaches a portion of the substrate, and an insulator layer formed within the trench. The substrate at least has a first region which is in a vicinity of a bottom portion of the trench and has an impurity density greater than that of the active layer, and the active layer has a second region in which elements of the semiconductor device are formed. This insulator layer has charges trapped in at least a predetermined portion thereof in a vicinity of the second region. According to the semiconductor device of the present invention, the lateral and vertical direction leak currents is prevented from flowing and no narrow channel effect occurs.

Other objects and further features of the present invention will be apparent from the following detailed description when read in conjunction with the accompanying drawings.

BRIEF DESCRIPTION OF THE DRAWINGS

FIGS. 20 through 22 respectively show sixth through eighth embodiments of the semiconductor device according to the present invention in which a trapped charge layer is provided in only an upper portion of a trench;

FIGS. 24 and 25 are cross sectional views respectively showing essential steps of producing the ninth embodiment;

DETAILED DESCRIPTION

Figure 1:
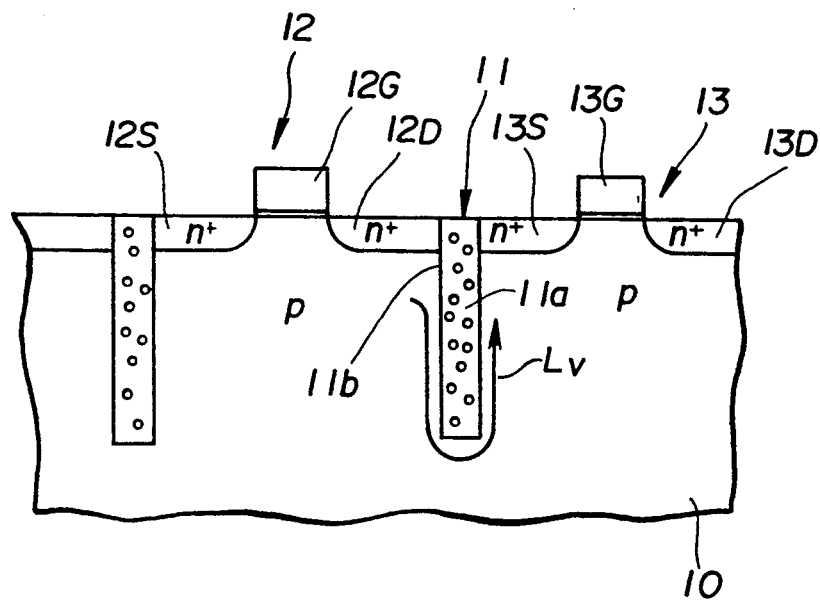
FIG. 1 is a cross sectional view generally showing a conventional semiconductor device having a trench isolation.
Figure 2:
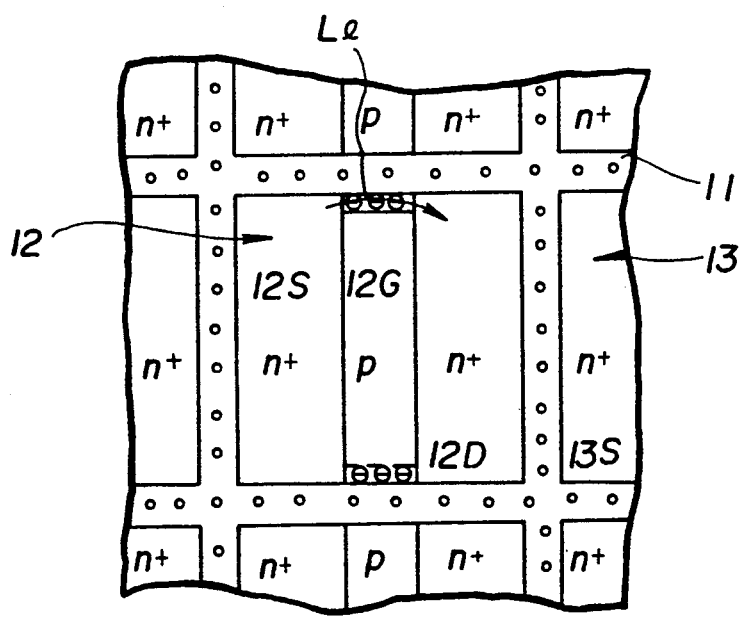
FIG. 2 is a plan view generally showing the conventional semiconductor device shown in FIG. 1.
Figure 3:
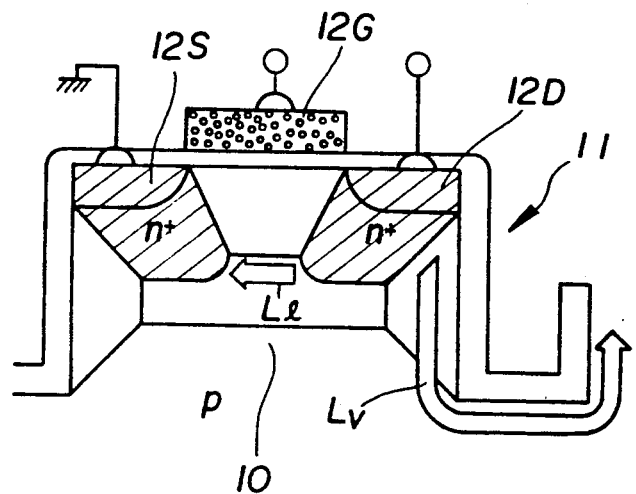
FIG. 3 is a schematic view of the conventional semiconductor device shown in FIGS. 1 and 2 for explaining vertical and lateral leak currents.
Figure 4:
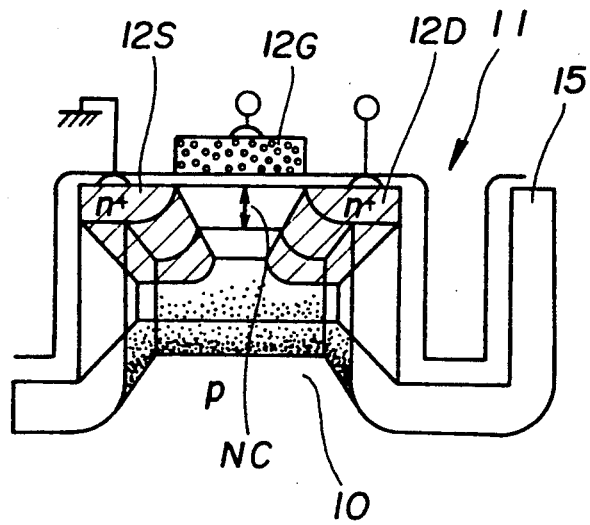
FIG. 4 is a schematic view of another conventional semiconductor device having a trench isolation.
Figure 5:
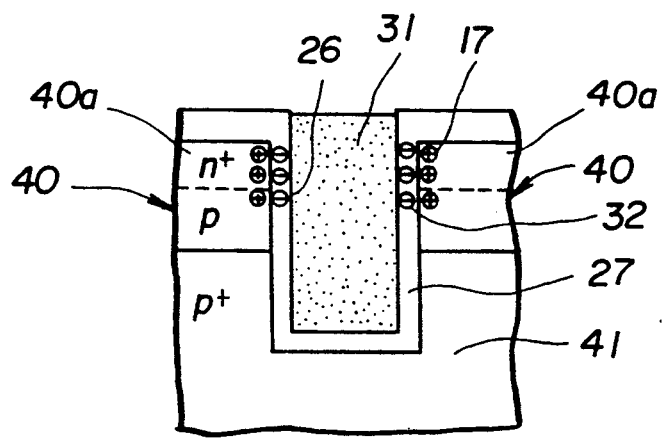
FIG. 5 is a cross sectional view showing an essential part of a semiconductor device for explaining the operating principle of the present invention.

First, a description will be given of the operating principle of the semiconductor device according to the present invention, by referring to FIG. 5. In FIG. 5, a trench 26 penetrates an active layer 40 in which elements of the semiconductor device are formed, and to a portion of a heavily doped layer 41. For example, the active layer 40 is a p-type layer and includes an n+-type diffusion region 40a formed to a thickness indicated by a phantom line. An oxide layer 27 which is used as an insulator layer is formed in the trench 26, and a trapped charge layer 32 is formed in the oxide layer 27 at least to a predetermined depth greater than the depth of the n+-type diffusion region 40a. In other words, the trapped charge layer 32 is formed in the oxide layer 27 at a portion at least confronting the n+-type diffusion region 40. Negative charges are trapped in the trapped charge layer 32. A positive charge induced layer 17 is formed in the active layer 40 on the outer side of the trapped charge layer 32. An insulator layer 31 made of polysilicon and the like is formed within the trench 26 on the surface of the oxide layer 27.

The heavily doped layer 41 formed at a lower portion of the trench 26 is a p+-type boron (B) layer, for example. This heavily doped layer 41 prevents a depletion layer from being formed at an interface between the active layer 40 and the oxide layer 27 within the trench 26, and it is thus possible to suppress the generation of the vertical direction leak current between two mutually adjacent elements of the semiconductor device. In addition, because the trapped charge layer 32 is formed in the oxide layer 27 at least to the predetermined depth greater than the depth of the n+-type diffusion region 40a, it is possible to prevent the active layer 40 from reaching a depletion state and hence suppress the generation of the lateral direction leak current within the element of the semiconductor device. Furthermore, since the impurities of the heavily doped layer 41 do not spread laterally at the n+-type region 40a where the elements of the semiconductor device are actually formed, it is possible to prevent the narrow channel effect.

Figure 6:
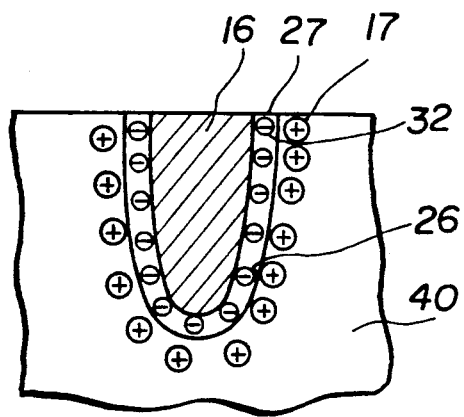
FIG. 6 is a cross sectional view showing an essential part of a first embodiment of the semiconductor device according to the present invention.

FIG. 6 shows an essential part of a first embodiment of the semiconductor device according to the present invention. In FIG. 6, those parts which are essentially the same as those corresponding parts in FIG. 5 are designated by the same reference numerals, and a description thereof will be omitted. In this embodiment, an insulator layer 16 made of SiO$_2$, Si$_3$N$_4$ and the like is formed within the trench 26, and the trapped charge layer 32 is formed in the entire oxide layer 27.

Figure 7:
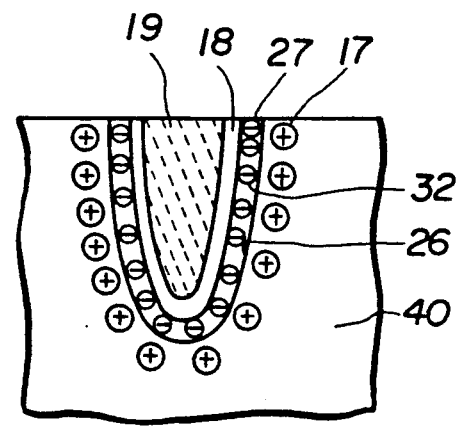
FIG. 7 is a cross sectional view showing an essential part of a second embodiment of the semiconductor device according to the present invention.

FIG. 7 shows an essential part of a second embodiment of the semiconductor device according to the present invention. In FIG. 7, those parts which are essentially the same as those corresponding parts in FIG. 6 are designated by the same reference numerals, and a description thereof will be omitted. In this embodiment, another insulator layer 18 is formed in the trench 26 on the inner side of the oxide layer 27. This other insulator layer 18 is made of SiO$_2$, Si$_3$N$_4$ and the like. In addition, a polysilicon layer 19 is formed within the trench 26.

Figure 8:
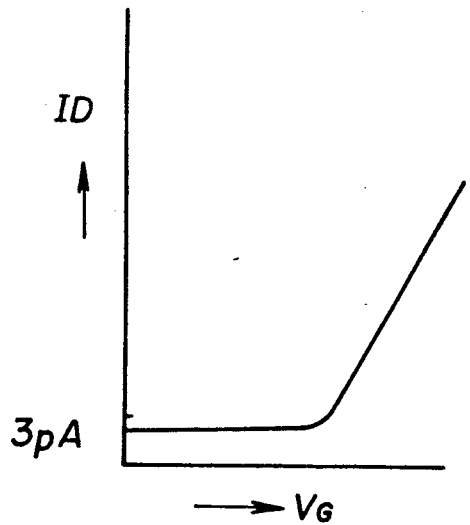
FIG. 8 shows a gate voltage versus drain current characteristic of an FET applied with the trench isolation structure of the first and second embodiments.
Figure 9:
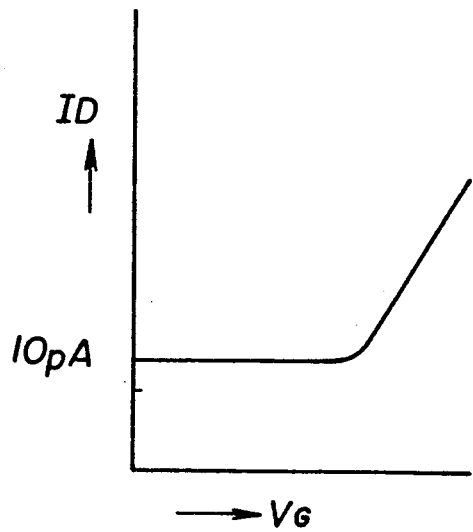
FIG. 9 shows a gate voltage versus drain current characteristic of an FET applied with the conventional trench isolation structure having no trapped charge layer.

FIG. 8 shows a gate voltage V$_G$ versus drain current I$_D$ characteristic of an FET applied with the trench isolation structure of the first and second embodiments described above. On the other hand, FIG. 9 shows a gate voltage $V_G$ versus drain current $I_D$ characteristic of an FET applied with the conventional trench isolation structure having no charge trapped layer. According to the conventional characteristic shown in FIG. 9, the drain current $I_D$ when no gate voltage is applied is approximately 10 pA. However, in the characteristic shown in FIG. 8 obtained by the first and second embodiments, the drain current $I_D$ is less than 3 pA when no gate voltage is applied. Therefore, it may be seen that the lateral direction leak current, that is, the drain-to-source leak current within the FET is greatly suppressed to approximately $\frac{1}{3}$ that of the conventional semiconductor device.

Figure 10A:
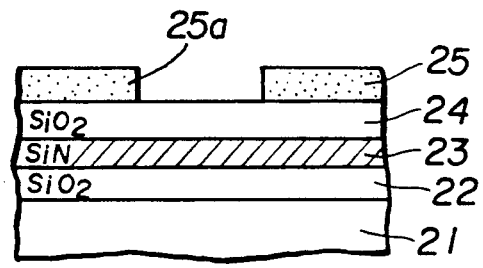
FIGS. 10A through 10F are cross sectional views respectively showing production steps for producing a third embodiment of the semiconductor device according to the present invention.

Next, a description will be given of a third embodiment of the semiconductor device according to the present invention by referring to production steps thereof shown in FIGS. 10A through 10F. In FIG. 10A, a silicon dioxide ($SiO_2$) layer 22, a silicon nitride ($Si_3N_4$) layer 23 and a silicon dioxide ($SiO_2$) layer 24 are formed in this sequence on a silicon (Si) substrate 21. For example, the $SiO_2$ layer 24 is formed by a chemical vapor deposition (CVD). In addition, a resist layer 25 is formed on the $SiO_2$ layer 24 and a window 25a is formed in the resist layer 25.

Figure 10B:
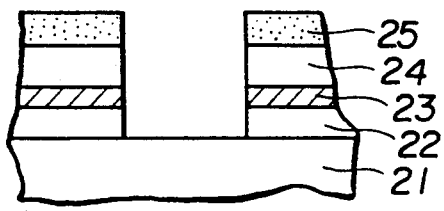
Figure 10C:
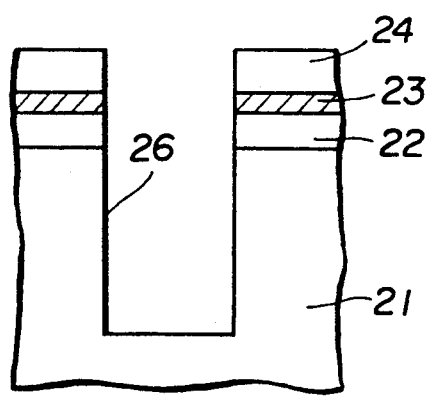

In FIG. 10B, an etching is carried out using the resist layer 25 as a mask. As a result, the layers 24, 23 and 22 below the window 25a are removed. Then, the resist layer 25 is removed to form the trench 26 as shown in FIG. 10C.

Figure 10D:
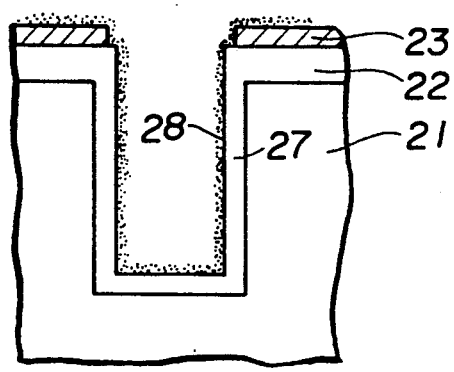
Figure 10E:
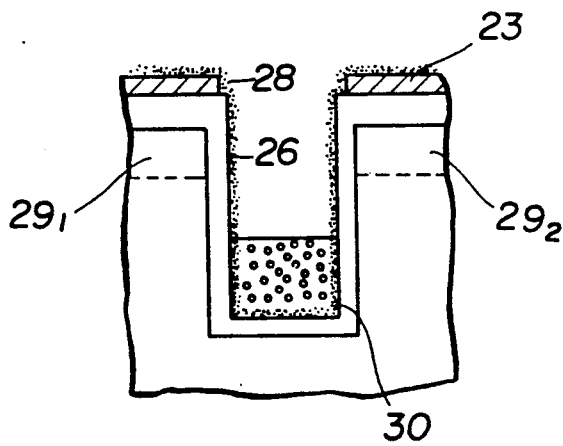

Next, the $SiO_2$ layer 24 is removed and the oxide layer 27 having a thickness of approximately 500 Å to 1000 Å is formed within the trench 26 as shown in FIG. 10D. Further, an aluminum (Al) molecular layer 28 is formed within the trench 26 on the surface of the oxide layer 27 by submerging the device in an Al aqueous solution. The Al aqueous solution may be a solution of 1000 ppm to 10000 ppm of Al compound such as a polyaluminum chloride $([Al_2(OH)_nCl_{6-n}]_m$, where $1<n<5$ and $m<10$). Then, a polyboron film 30 is formed within the trench 26 as shown in FIG. 10E at a temperature of approximately 600° C. at a portion below diffusion regions $29_1$ and $29_2$ where the $n^+$-type source and drain regions of FETs will be formed at a latter stage of the production.

Figure 10F:
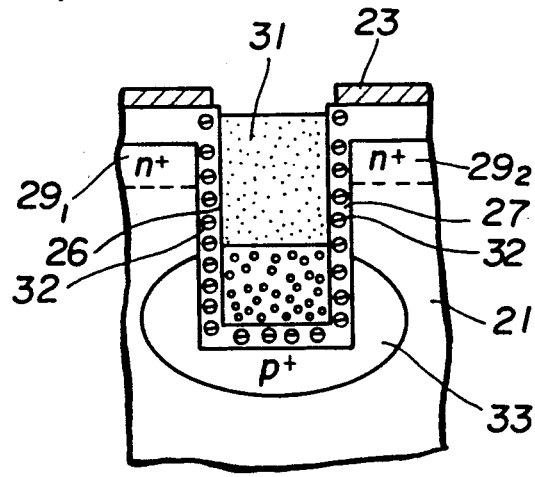

Thereafter, a polysilicon layer 31 is formed within the trench 26 at a temperature of approximately 700° C. as shown in FIG. 10F. In this state, Al diffuses from the Al molecular layer 28 into the oxide layer 27 and forms the trapped charge layer 32 having the negative charges. On the other hand, boron (B) within the polyboron film 30 diffuses into the substrate 21 and forms a $p^+$-type impurity region 33. Then, the SiN layer 23 on the top is removed and the polysilicon layer 31 is formed within the remaining portion of the trench 26. The $p^+$-type impurity region 33 corresponds to the heavily doped layer 41 shown in FIG. 5.

The method of forming the trapped charge layer 32 of the negative charges is not limited to the above. For example, it is possible to employ known methods such as implanting Al ions, diffusing Al by forming an aluminum thin film, and forming a layer which has the negative charges by itself.

According to this embodiment, it is possible to suppress the vertical direction leak current between two mutually adjacent elements of the semiconductor device because the $p^+$-type impurity region 33 is formed below the diffusion regions $29_1$ and $29_2$ at the trench 26.

In addition, because the trapped charge layer 32 having the negative charges is formed in the oxide layer 27, positive charges are induced in the substrate 21 at the portion where the trapped charge layer 32 exists and it is thus possible to suppress the lateral direction leak current within the same element of the semiconductor device. Moreover, it is possible to prevent the narrow channel effect since the B impurities will not spread laterally in a vicinity of the diffusion regions $29_1$ and $29_2$.

Figure 11:
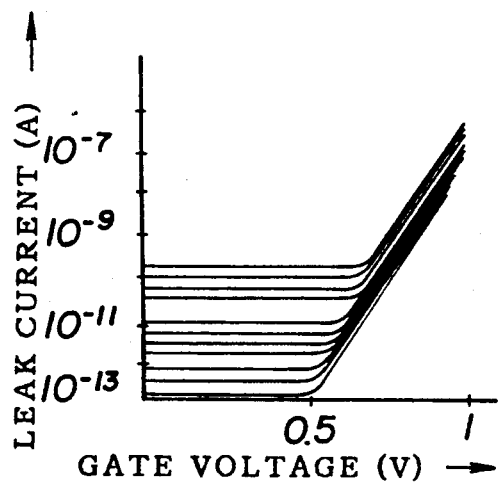
FIG. 11 shows a gate voltage versus lateral direction leak current characteristic of the conventional semiconductor device having no trapped charge layer for a number of semiconductor devices having identical structures.
Figure 12:
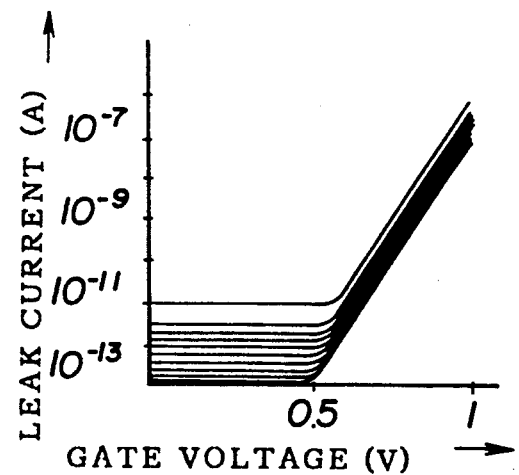
FIG. 12 shows a gate voltage versus lateral direction leak current characteristic obtainable by the third embodiment for a number of semiconductor devices having identical structures.

A gate voltage versus lateral direction leak current characteristic of the conventional semiconductor device having no trapped charge layer is shown in FIG. 11 for a number of semiconductor devices having identical structures, and a corresponding characteristic obtainable by this embodiment is shown in FIG. 12 for a number of semiconductor devices having identical structures. In FIG. 11, the lateral direction leak current is relatively large and falls within a relatively large range. But according to this embodiment, it may be seen from FIG. 12 that the lateral direction leak current is suppressed and falls within a smaller range compared to the conventional case shown in FIG. 13.

Figure 13:
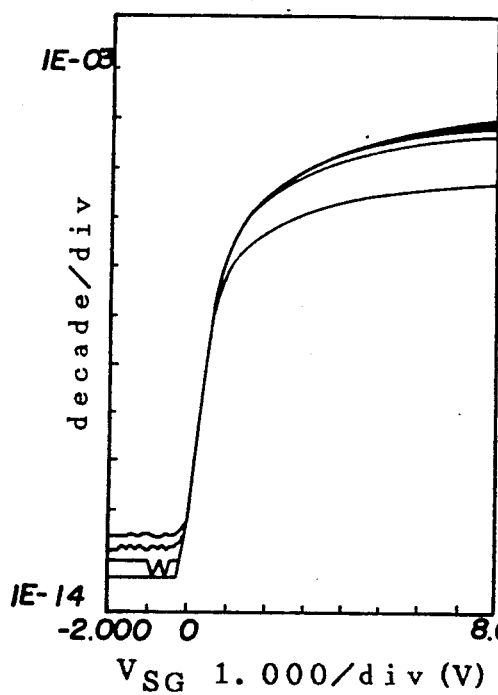
FIGS. 13 and 14 respectively show applied voltage versus drain current characteristics of the conventional semiconductor device having no Al ion implantation and the semiconductor device of the third embodiment having the Al+ ion implantation.
Figure 14:
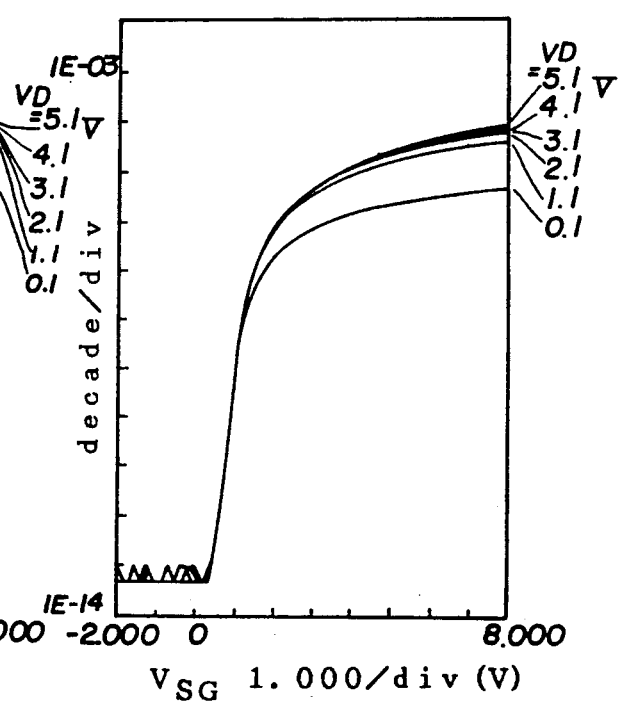
Figure 15:
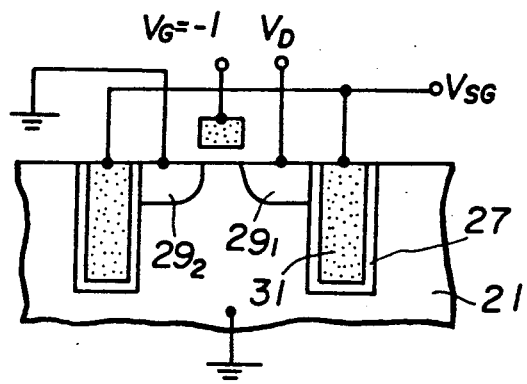
FIG. 15 shows an arrangement used to measure the characteristics shown in FIGS. 13 and 14 for various drain voltages.

FIGS. 13 and 14 respectively show applied voltage $V_{SG}$ versus drain current $I_D$ characteristics of the conventional semiconductor device having no Al ion implantation and the semiconductor device of this embodiment having the $Al^+$ ion implantation at at an energy of 40 keV to a dosage of $1 \times 10^{14}$ cm$^{-2}$. The characteristics shown in FIGS. 13 and 14 were measured for drain voltages $V_D$ of 5.1 V, 4.1 V, 3.1 V, 2.1 V, 1.1 V and 0.1 V with a gate voltage $V_G$ of $-1$ V based on an arrangement shown in FIG. 15 in which the same designations are used as in FIGS. 10A through 10F. It may be seen by comparing FIGS. 13 and 14 that the applied voltage $V_{SG}$ must be larger according to this embodiment than in the conventional case shown in FIG. 13 in order to obtain the same drain current $I_D$. Therefore, it is confirmed that the lateral direction leak current is prevented from flowing within the same element of the semiconductor device when the structure of this embodiment is employed.

Next, a description will be given of a fourth embodiment of the semiconductor device according to the present invention by referring to production steps thereof shown in FIGS. 16A through 16F. In FIGS. 16A through 16F, those parts which are the same as those corresponding parts in FIGS. 10A through 10F are designated by the same reference numerals, and a description thereof will be omitted.

Figure 16A:
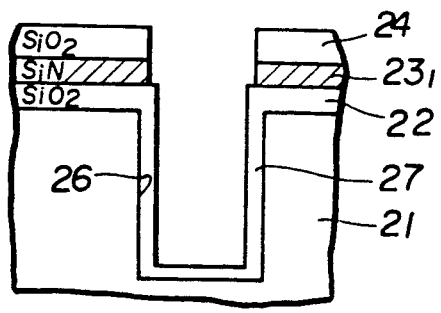
FIGS. 16A through 16F are cross sectional views respectively showing production steps for producing a fourth embodiment of the semiconductor device according to the present invention.
Figure 16B:
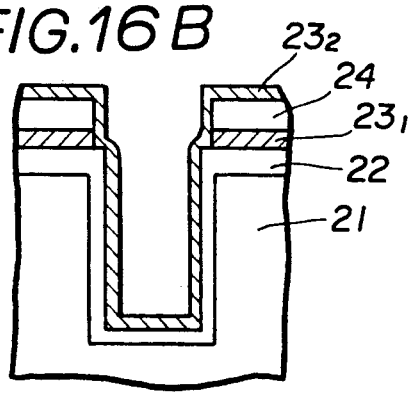

The steps shown described before in conjunction with FIGS. 10A through 10C are carried out and the oxide layer 27 is formed within the trench 26 to obtain the structure shown in FIG. 16A. In FIG. 16A, a SiN layer $23_1$ is formed in place of the SiN layer 23 shown in FIGS. 10A through 10C. Then, a SiN layer $23_2$ is formed on the $SiO_2$ layer 24 and within the trench 26 on the surface of the oxide layer 27 as shown in FIG. 16B.

Figure 16C:
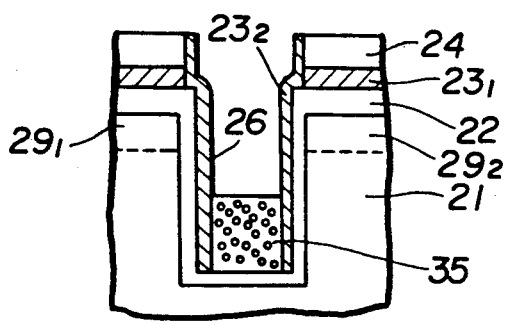
Figure 16D:
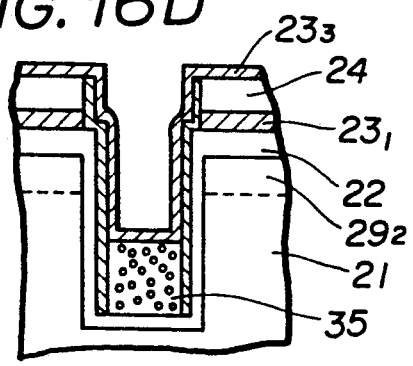

Next, an anisotropic etching is carried out to remove a portion of the SiN layer $23_2$ at the bottom of the trench 26, and an spin-on-glass (SOG) layer 35 is formed within the trench 26 as shown in FIG. 16C at a portion below the diffusion regions $29_1$ and $29_2$ where the $n^+$-type source and drain regions of the FETs will be formed at a latter stage of the production. For example, the SOG layer 35 is formed by a chemical liquid deposition (CLD). Thereafter, a SiN layer $23_3$ is formed on the SiO$_2$ layer 24 and within the trench 26 as shown in FIG. 16D.

Figure 16E:
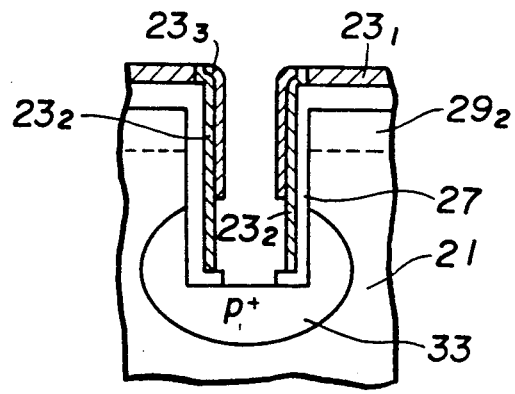

Then, a portion of the SiN layer 23$_3$ on the SiO$_2$ layer 24 is removed by an anisotropic etching, and the SiO$_2$ layer 24 and the SOG layer 35 are removed as shown in FIG. 16E. A bottom portion of the oxide layer 27 within the trench 26 is also removed. In addition, the p$^+$-type impurity region 33 is formed by implanting B ions into the substrate 21 by a rotating ion implantation method. The B ions are implanted only at the bottom portion of the trench 26 where only the SiN layer 23$_2$ exists or no SiN layer exists, because the upper portion of the trench 26 has a thick SiN layer made up of the SiN layers 23$_2$ and 23$_3$ and the B ions cannot diffuse through this thick SiN layer.

Figure 16F:
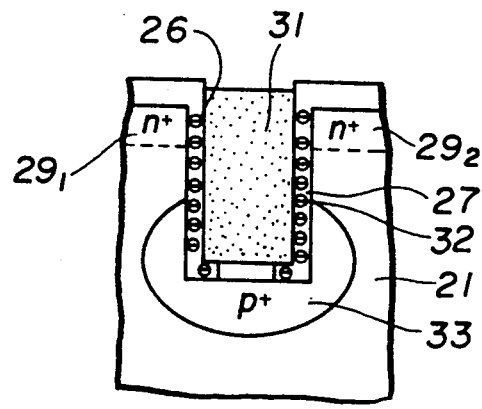

Next, the SiN layers 23$_1$, 23$_2$ and 23$_3$ are removed. In addition, an Al molecular layer is formed within the trench 26 on the surface of the oxide layer 27 and subjected to a thermal process to diffuse the Al and form the trapped charge layer 32 in the oxide layer 27 as shown in FIG. 16F. Thereafter, the bottom portion of the trench 26 is oxidized and the polysilicon layer 31 is formed within the trench 26.

In this embodiment, the p$^+$-type impurity region 33 is formed by the ion implantation. For this reason, it is possible to more accurately control the depth and the doping quantity of the p$^+$-type impurity region 33 compared to the third embodiment shown in FIGS. 10A through 10F employing the thermal process. But the effects obtainable by this embodiment is basically the same as those of the third embodiment.

Figure 17:
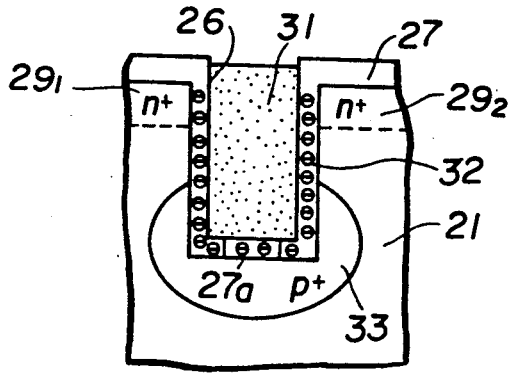
FIG. 17 is a cross sectional view showing a modification of the fourth embodiment.

As a modification of the fourth embodiment, it is possible to form an oxide layer 27a at the bottom portion of the trench 26 after the step shown in FIG. 16E before forming the polysilicon layer 31 within the trench 26. In this modification, a structure shown in FIG. 17 is obtained in place of that shown in FIG. 16F.

Next, a description will be given of a fifth embodiment of the semiconductor device according to the present invention by referring to production steps thereof shown in FIGS. 18A through 18F. In FIGS. 18A through 18F, those parts which are the same as those corresponding parts in FIGS. 16A through 16F are designated by the same reference numerals, and a description thereof will be omitted.

Figure 18A:
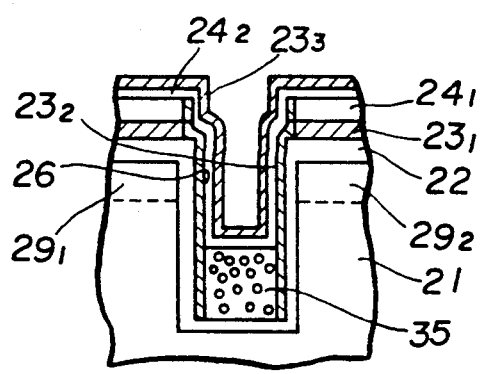
FIGS. 18A through 18F are cross sectional views respectively showing production steps for producing a fifth embodiment of the semiconductor device according to the present invention.
Figure 18B:
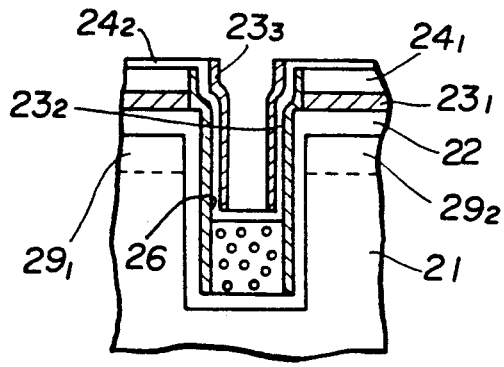
Figure 18C:
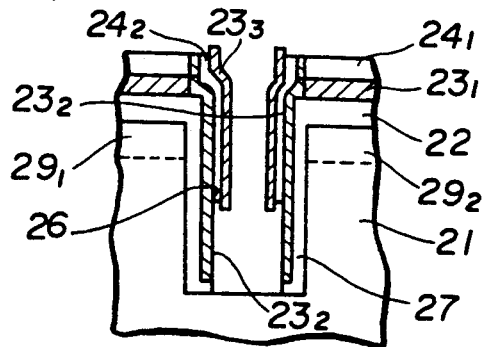

The steps shown described before in conjunction with FIGS. 16A and 16B are carried out before a step shown in FIG. 18A. In FIG. 18A, a SiO$_2$ layer 24$_1$ is formed in place of the SiO$_2$ layer 24 shown in FIGS. 16A and 16B. Then, after forming the SOG layer 35 at the bottom portion of the trench 26, a SiO$_2$ layer 24$_2$ is formed within the trench 26 by a CVD and a SiN layer 23$_3$ is further formed within the trench on the surface of the SiO$_2$. In FIG. 18B, an anisotropic etching is carried out to remove a portion of the SiN layer 23$_3$ at the bottom of the trench 26. Next, the SiO$_2$ layer 24$_2$ at the surface portion is removed by an etching, and the remaining SiN layer 23$_3$ is used as a mask to remove the SOG layer 35 as shown in FIG. 18C. In this state, a portion of the SiO$_2$ layer 24$_2$ remains within the trench 26.

Figure 18D:
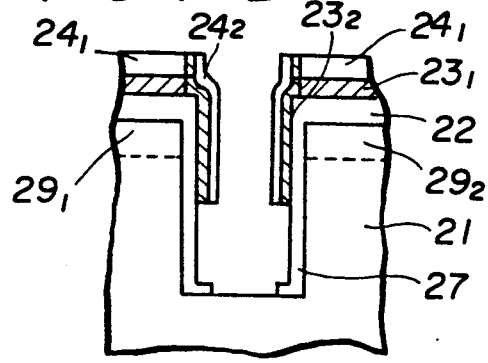
Figure 18E:
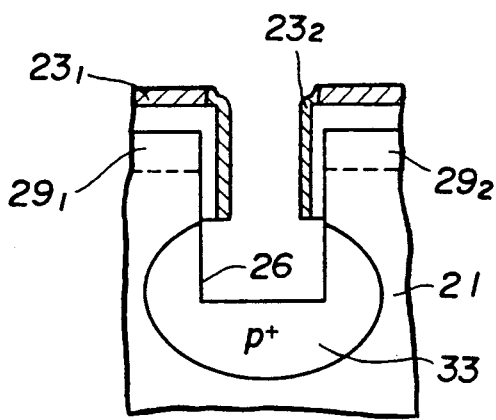

Thereafter, when the SiN layer 23$_3$ is removed in its entirety by an etching, the SiN layer 23$_3$ and the oxide layer 24$_2$ are used as masks so that a portion of the SiN layer 23$_2$ at the bottom portion of the trench 26 is simultaneously removed as shown in FIG. 18D. Next, the SiO$_2$ layers 24$_2$ and 24$_1$ and a portion of the oxide layer 27 at the bottom portion of the trench 26 are removed as shown in FIG. 18E. In addition, the p$^+$-type impurity region 33 is formed by a gas diffusion or a solid phase diffusion. For example, boron trichloride (BCl$_3$) liquid is used in the gas diffusion to form the p$^+$-type impurity region 33 by a chemical reaction described by $2BCl_3 \rightarrow 2B + 3Cl_2$. On the other hand, boron nitride (BN) solid is used in the solid phase diffusion to form the p$^+$-type impurity region 33 by a chemical reaction described by $2BN \rightarrow 2B + N_2$.

Figure 18F:
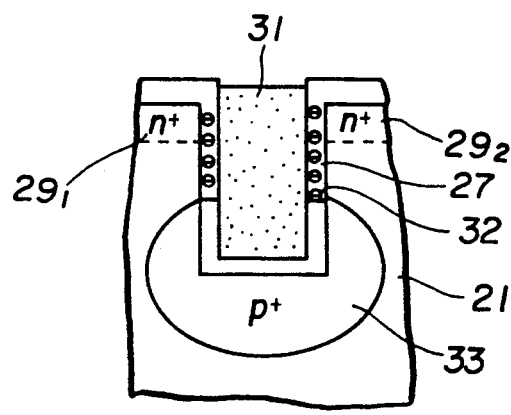

Finally, the SiN layers 23$_1$ and 23$_2$ are removed and the trapped charge layer 32 is formed in the oxide layer 27. In addition the bottom portion of the trench 26 is oxidized and the polysilicon layer 31 is formed within the trench 26 as shown in FIG. 18F.

Figure 19:
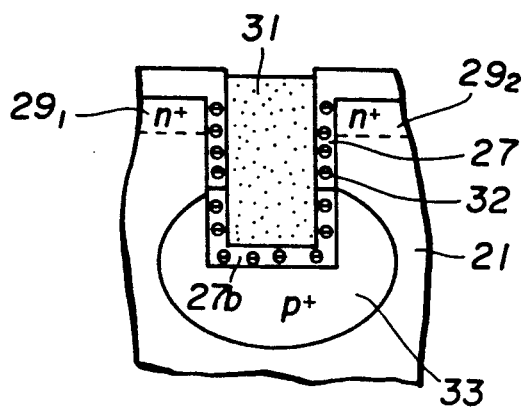
FIG. 19 is a cross sectional view showing a modification of the fifth embodiment.

As a modification of the fifth embodiment, it is possible to form an oxide layer 27b at the bottom portion of the trench 26 after the step shown in FIG. 18E before forming the trapped charge layer 32 and the polysilicon layer 31. In this modification, a structure shown in FIG. 19 is obtained in place of that shown in FIG. 18F.

In the embodiments shown in FIGS. 10A through 10F, 16A through 16F, 17, 18A through 18F and 19, the trapped charge layer 32 is formed in the entire oxide layer 27. However, it is of course possible to provide the trapped charge layer 32 in only a portion of the oxide layer 27 at an upper portion of the trench 26. In this case, it is possible to form the trapped charge layer 32 in only the upper portion of the trench 26 by implanting Al ions in a predetermined direction to the trench 26 so that the Al ions do not reach the bottom portion of the trench 26. FIGS. 20 through 22 respectively show sixth through eighth embodiments of the semiconductor device according to the present invention in which the trapped charge layer 32 is provided in only the upper portion of the trench 26. In FIGS. 20 through 22, those parts which are essentially the same as those corresponding parts of the embodiments described heretofore are designated by the same reference numerals, and a description thereof will be omitted.

In FIG. 20, the trapped charge layer 32 is formed in a portion of the oxide layer 27 to a region below lower ends of depletion regions 36$_1$ and 36$_2$ which are formed in a latter stage of the production simultaneously as when the diffusion regions 29$_1$ and 29$_2$ are formed. In addition, the p$^+$-type diffusion region 33 is formed so as not to connect to the lower ends of the depletion regions 36$_1$ and 36$_2$. In this embodiment, a large withstand voltage is obtainable at a pn junction because the p$^+$-type diffusion region 33 does not connect to the depletion regions 36$_1$ and 36$_2$, thereby making this embodiment suited for application to semiconductor devices requiring the large withstand voltage at the pn junction.

In FIG. 21, the trapped charge layer 32 is formed in the portion of the oxide layer 27 to the region below the lower ends of depletion regions 36$_1$ and 36$_2$ as in the case shown in FIG. 20. But in this embodiment, the p$^+$-type diffusion region 33 is formed to a region above the lower ends of the depletion regions 36$_1$ and 36$_2$ and below the lower ends of the diffusion regions 29$_1$ and 29$_2$. Hence, the withstand voltage obtainable at the pn junction is smaller compared to that of FIG. 20 because the p$^+$-type diffusion region 33 connects to the depletion regions 36$_1$ and 36$_2$, thereby making this embodiment suited for application to semiconductor devices not requiring a large withstand voltage at the pn junction.

In FIG. 22, the trapped charge layer 32 is formed in the portion of the oxide layer 27 to the region below the lower ends of depletion regions $36_1$ and $36_2$ as in the case shown in FIG. 20. But in this embodiment, the p+-type diffusion region 33 is formed to a region above the lower ends of the depletion regions $36_1$ and $36_2$ and connecting to the lower ends of the diffusion regions $29_1$ and $29_2$. Hence, the withstand voltage obtainable at the pn junction is even smaller compared to the case shown in FIG. 21. However, the effect of reducing the leak current at the junction is notable as in the cases shown in FIGS. 20 and 21.

The embodiments described heretofore do not employ an epitaxial layer. However, the present invention is also applicable to a case where a lightly doped epitaxial layer is formed on a heavily doped substrate.

Figure 23A:
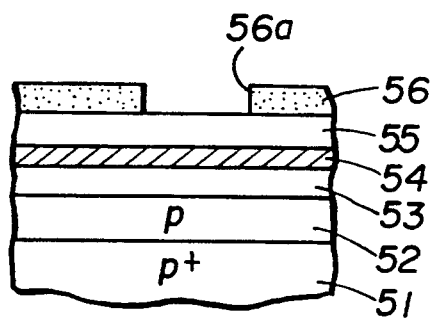
FIGS. 23A through 23G are cross sectional views respectively showing production steps for producing a ninth embodiment of the semiconductor device according to the present invention.

Next, a description will be given of a ninth embodiment of the semiconductor device according to the present invention by referring to production steps thereof shown in FIGS. 23A through 23G. First, a structure shown in FIG. 23A is prepared. This structure has a p+-type substrate 51, a p-type epitaxial layer 52 epitaxially grown on the p+-type substrate 51 to a thickness of approximately 0.5 micron to 3 microns, a first SiO₂ layer 53 formed on the p-type epitaxial layer 52, a first SiN layer 54 formed on the first SiO₂ layer 53, a second SiO₂ layer 55 formed on the first SiN layer 54, and a resist layer 56 formed on the second SiO₂ layer 55 and having a window 56a.

Figure 23B:
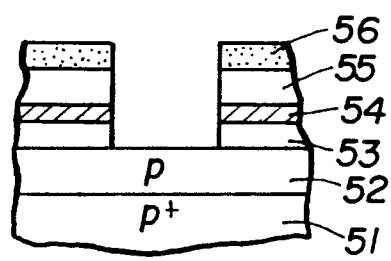
Figure 23C:
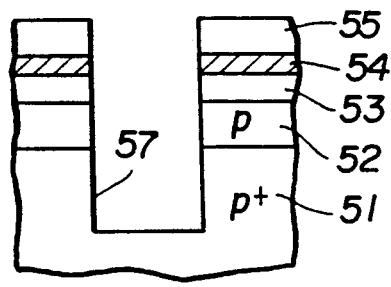

An etching is carried out through the window 56a by using the resist layer 56 as a mask to remove portions of the layers 55, 54 and 53 below the window 56a as shown in FIG. 23B. Then, the resist layer 56 is removed and a trench 57 is formed as shown in FIG. 23C. This trench 57 penetrates the p-type epitaxial layer 52 and extends to a portion of the p+-type substrate 51.

Figure 23D:
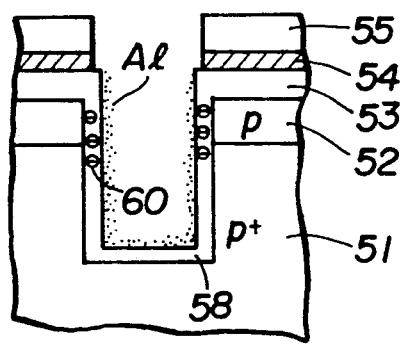

Next, in FIG. 23D, a third SiO₂ layer 58 is formed within the trench 57 as an oxide layer, and Al ions are implanted in the third SiO₂ layer 58 so as to form a trapped charge layer 60 of negative charges. The trapped charge layer 60 may be formed in the entire oxide layer 58 as shown in FIG. 24 or only in a portion of the oxide layer 58 at the upper portion of the trench 57 as shown in FIG. 25. In FIGS. 24 and 25, $59_1$ and $59_2$ denote diffusion regions where the n+-type source and drain regions of FETs will be formed at a latter stage of the production.

Figure 23E:
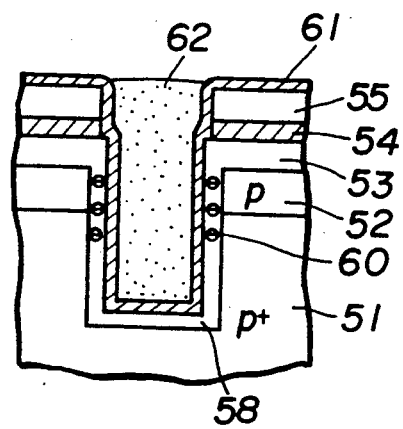
Figure 23F:
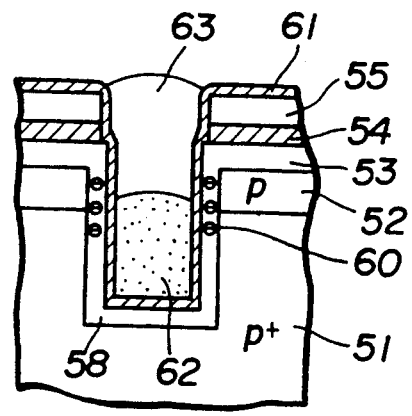
Figure 23G:
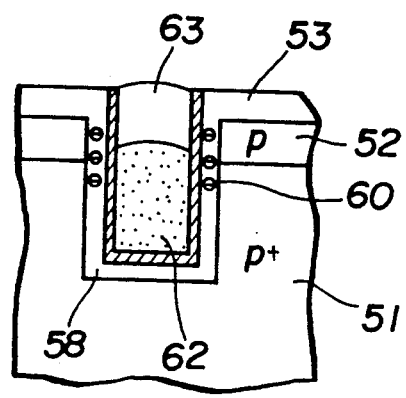

After the step shown in FIGS. 24 or 25, a second SiN layer 61 is formed within the trench 57 and on the second SiO₂ layer 55. Then, a polysilicon layer 62 is formed in the trench 57 on the surface of the second SiN layer 61 as shown in FIG. 23E. Then, a polysilicon oxide layer 63 is formed on the polysilicon layer 62 as shown in FIG. 23F. Finally, a top portion of the second SiN layer 61, the second SiO₂ layer 55, and the first SiN layer 54 are removed as shown in FIG. 23G. In FIGS. 23E through 23G, the illustration of the diffusion regions $59_1$ and $59_2$ is omitted.

Figure 26:
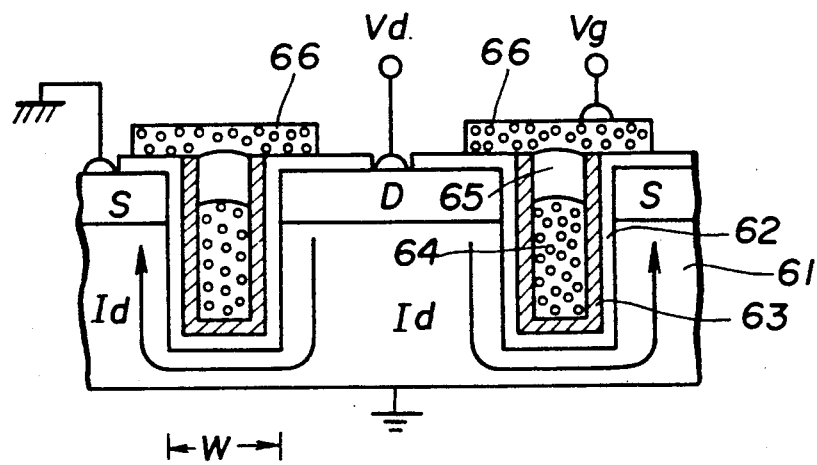
FIG. 26 is a diagram generally showing an arrangement used to measure a vertical direction leak current between elements of the semiconductor device.

FIG. 26 is a diagram generally showing an arrangement used to measure a vertical direction leak current between elements of the semiconductor device. The semiconductor device shown in FIG. 26 is a buried ring-gate metal oxide semiconductor field effect transistor (MOSFET), and S and D respectively denote the source and drain regions of the MOSFETs. In addition, Vd denotes a drain voltage and Vg denotes a gate voltage. The semiconductor device shown in FIG. 26 has a p-type substrate 61, a SiO₂ layer 62, a SiN layer 63, a polysilicon layer 64, a polysilicon oxide layer 65 and electrodes 66.

Figure 27:
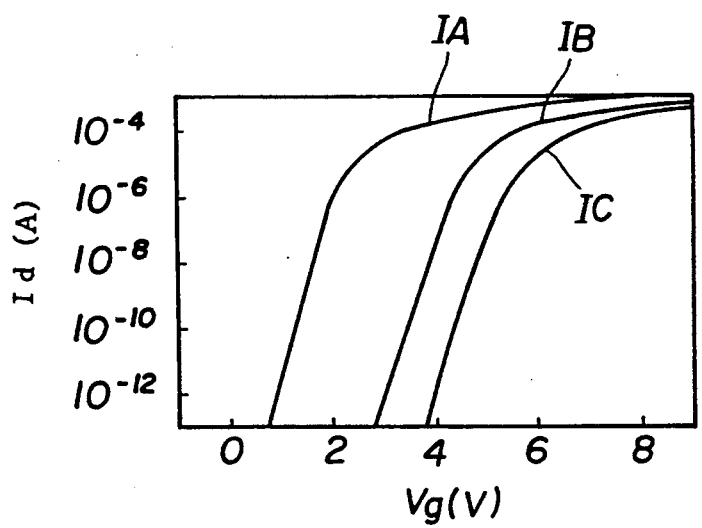
FIG. 27 shows gate voltage versus drain current characteristics for the conventional semiconductor device and the semiconductor device according to the present invention.

FIG. 27 shows a gate voltage versus drain current characteristics for the conventional semiconductor device and the semiconductor device according to the present invention. These characteristics were measured by use of the arrangement shown in FIG. 26 under conditions that a trench isolation width W is 1 micron, a depth of the source and drain regions S and D is 0.2 micron to 3 microns, a depth of the trench isolation is 0.3 micron, the source and drain regions S and D are doped to a dosage of approximately $4 \times 10^{15}$ cm$^{-2}$, a resistivity of the p-type substrate 61 is approximately 10 Ωcm, the drain voltage Vd is 5 V and a substrate voltage Vsub is $-2.5$ V. In the conventional semiconductor device in which no Al ions are implanted in the oxide layer 62 and no trapped charge layer of the negative charges exists in the oxide layer 62, a characteristic IA shown in FIG. 27 is obtained. But when the present invention is applied by implanting Al ions to a dosage of $1 \times 10^{14}$ cm$^{-2}$ to form the trapped charge layer in the oxide layer 62, a characteristic IB shown in FIG. 27 is obtained. In addition, a characteristic IC shown in FIG. 27 is obtained when Al ions are implanted to a dosage of $5 \times 10^{14}$ cm$^{-2}$ to form the trapped charge layer in the oxide layer 62. It may be seen by comparing the characteristics IB and IC with the characteristic IA that the lateral direction leak current between two mutually adjacent elements of the semiconductor device is greatly suppressed according to the present invention.

Further, the present invention is not limited to these embodiments, but various variations and modifications may be made without departing from the scope of the present invention.

What is claimed is:

1. A semiconductor device having a trench isolation structure comprising:
    a substrate made of a first type semiconductor, said first type semiconductor being one of n-type and p-type semiconductors;
    an active layer formed on said substrate and also made of at least one of the first type semiconductor and a second type semiconductor, said second type semiconductor being opposite said first type semiconductor;
    a trench which penetrates said active layer and reaches a portion of said substrate, wherein a pn junction contacts a side surface of said trench; and
    an insulator layer formed within said trench and formed substantially around a peripheral portion of said trench,
    said active layer having a region in which elements of the semiconductor device are formed,
    said insulator layer penetrating, along with said trench, said active layer and a portion of said substrate, and having charges trapped in only a predetermined portion thereof in a vicinity of said region, said charges being trapped in a portion of said insulator layer which covers said pn junction at said side surface of said trench, and wherein a portion of said insulator layer above said active layer outside said trench is free from said trapped charges,
    said predetermined portion of said insulator layer having a depth which is greater than a depth of said region of said active layer.

2. A semiconductor device having a trench isolation structure comprising:

a substrate made of a first type semiconductor, said first type semiconductor being one of n-type and p-type semiconductors;

an active layer formed on said substrate and also made of at least one of the first type semiconductor and a second type semiconductor, said second type semiconductor being opposite said first type semiconductor;

a trench which penetrates said active layer and reaches a portion of said substrate, wherein a pn junction contacts a side surface of said trench; and an insulator layer formed within said trench and formed substantially around a peripheral portion of said trench, said substrate at least having a first region which is in a vicinity of a bottom portion of said trench and has an impurity density greater than that of said active layer, said active layer having a second region in which elements of the semiconductor device are formed, said insulator layer penetrating, along with said trench, said active layer and a portion of said substrate, and having charges trapped in at least a predetermined portion thereof in a vicinity of said second region, said charges being trapped in a portion of said insulator layer which covers said pn junction at said side surface of said trench.

3. A semiconductor device as claimed in claim 2 in which said predetermined portion of said insulator layer has a depth which is greater than a depth of said second region of said active layer.

4. A semiconductor device as claimed in claim 3 in which said active layer comprises said second region and a depletion region located immediately under said second region, said first region extending from a depth greater than a depth of said depletion region.

5. A semiconductor device as claimed in claim 3 in which said active layer comprises said second region and a depletion region located immediately under said second region, said first region extending from a depth greater than the depth of said second region and less than a depth of said depletion region.

6. A semiconductor device as claimed in claim 3 in which said active layer comprises said second region and a depletion region located immediately under said second region, said first region extending from a depth approximately coinciding with the depth of said second region.

7. A semiconductor device as claimed in claim 2 in which said insulator layer is formed on all of inner walls of said trench.

8. A semiconductor device as claimed in claim 2 in which said insulator layer is formed on all of inner walls of said trench excluding a bottom portion thereof.

9. A semiconductor device as claimed in claim 2 in which said insulator layer has the charges trapped in its entirety.

10. A semiconductor device as claimed in claim 2 which further comprises another insulator layer which fills an inside of said trench.

11. A semiconductor device as claimed in claim 2 in which said first type semiconductor is a p-type semiconductor, and said second region of said active layer is an n-type region.

12. A semiconductor device as claimed in claim 11 in which said insulator layer has negative charges trapped in at least said predetermined portion thereof.

13. A semiconductor device as claimed in claim 11 in which said insulator layer is an oxide layer formed within said trench.

14. A semiconductor device as claimed in claim 2 in which said substrate is made of a heavily doped first type semiconductor and said active layer is an epitaxial layer made of a lightly doped first type semiconductor having an impurity concentration less than that of said heavily doped first type semiconductor.

15. A semiconductor device as claimed in claim 14 in which said first region of said substrate is constituted by said substrate itself.

16. A semiconductor device as claimed in claim 14 in which said first type semiconductor is a p-type semiconductor, and said second region of said active layer is an n-type region.

17. A semiconductor device as claimed in claim 14 in which said insulator layer has negative charges trapped in at least said predetermined portion thereof.

18. A semiconductor device as claimed in claim 14 in which said insulator layer is an oxide layer formed within said trench.

19. A semiconductor device as claimed in claim 2 in which said second region of said active layer is a region in which drain and source of a field effect transistor are formed.

20. A semiconductor device as claimed in claim 2 in which said insulator layer is formed on all of inner walls of said trench excluding a bottom portion thereof, and said bottom portion having formed thereon another insulator layer having no charges trapped therein.

21. A semiconductor device having a trench isolation structure comprising:

a substrate made of a first type semiconductor, said first type semiconductor being one of n-type and p-type semiconductors;

an active layer formed on said substrate and also made of the first type semiconductor;

a trench which penetrates said active layer and reaches a portion of said substrate; and an insulator layer formed within said trench and formed substantially around a peripheral portion of said trench, said substrate at least having a first region which is in a vicinity of a bottom portion of said trench and has an impurity density greater than that of said active layer, said active layer having a second region in which elements of the semiconductor device are formed, wherein said active layer comprises said second region and a depletion region located immediately under said second region, said first region extending from a depth approximately coinciding with the depth of said second region, said insulator layer penetrating, along with said trench, said active layer and a portion of said substrate, and having charges trapped in at least a predetermined portion thereof in a vicinity of said second region, wherein said predetermined portion of said insulator layer has a depth which is greater than a depth of said second region of said active layer.

22. A semiconductor device having a trench isolation structure comprising:

a substrate made of a first type semiconductor, said first type semiconductor being one of n-type and p-type semiconductors;

an active layer formed on said substrate and also made of the first type semiconductor;

a trench which penetrates said active layer and reaches a portion of said substrate; and an insulator layer formed within said trench and formed substantially around a peripheral portion of said trench, said substrate at least having a first region which is in a vicinity of a bottom portion of said trench and has an impurity density greater than that of said active layer, said active layer having a second region in which elements of the semiconductor device are formed, said insulator layer penetrating, along with said trench, said active layer and a portion of said substrate, and having charges trapped in at least a predetermined portion thereof in a vicinity of said second region, wherein said insulator layer has said charges trapped in its entirety.

23. A semiconductor device as claimed in claim 2 wherein a portion of said insulator layer above said active layer outside said trench is free from said trapped charges.

* * * * *